US007777472B2

(12) United States Patent
Uehara

(10) Patent No.: US 7,777,472 B2
(45) Date of Patent: Aug. 17, 2010

(54) CURRENT DETECTOR CIRCUIT AND CURRENT MODE SWITCHING REGULATOR

(75) Inventor: Osamu Uehara, Chiba (JP)

(73) Assignee: Seiko Instruments Inc. (JP)

( * ) Notice: Subject to any disclaimer, the term of this patent is extended or adjusted under 35 U.S.C. 154(b) by 157 days.

(21) Appl. No.: 12/070,131

(22) Filed: Feb. 15, 2008

(65) Prior Publication Data

US 2008/0218142 A1 Sep. 11, 2008

(30) Foreign Application Priority Data

Feb. 17, 2007 (JP) ............................. 2007-037223

(51) Int. Cl.
*G05F 1/00* (2006.01)
(52) U.S. Cl. ................... 323/284; 323/285; 323/351; 323/277
(58) Field of Classification Search ................ 323/275, 323/276, 277, 278, 317, 284, 285, 351; 324/710, 324/712
See application file for complete search history.

(56) References Cited

U.S. PATENT DOCUMENTS

| 5,757,174 A * | 5/1998 | Ki ............................. 323/284 |
| 2002/0135345 A1 | 9/2002 | Terashi |
| 2007/0108947 A1* | 5/2007 | Liao .......................... 323/222 |
| 2007/0120547 A1* | 5/2007 | Tateishi et al. ............... 323/282 |
| 2007/0159151 A1* | 7/2007 | Katoh et al. ................. 323/285 |
| 2009/0201000 A1* | 8/2009 | Kojima et al. ............... 323/282 |

FOREIGN PATENT DOCUMENTS

JP   2002-281742   9/2002

OTHER PUBLICATIONS

Cheng-Hui Chang and Robert C. Chang, "A Novel Current Sensing Circuit for a Current-Mode Control CMOS DC-DC Buck Converter", Apr. 2005, IEEE.*
Cheung Fai Lee and Philip K. T. Mok, "On-Chip Current Sensing Technique for CMOS Monolithic Switch-Mode Power Converters", 2002 IEEE.*

* cited by examiner

*Primary Examiner*—Jessica Han
*Assistant Examiner*—Jeffrey Gblende
(74) *Attorney, Agent, or Firm*—Adams & Wilks

(57) ABSTRACT

A current detector circuit detects a current supplied to a load and generates as a detection result a voltage corresponding to the detected current. A first p-channel transistor has a source connected to a power supply and a gate connected to a ground, and is configured to allow the passage therethrough of a current that is 1/N of a current flowing through a transistor which drives the load. A second p-channel transistor has a source connected to a drain of the first p-channel transistor, and a third p-channel transistor is connected to the load. A voltage mirror circuit has first and second terminals connected to respective drains of the second and third p-channel transistors. A n-channel transistor has a drain connected to the drain of the first p-channel transistor and outputs a source voltage as the detection result of the current detector circuit.

20 Claims, 4 Drawing Sheets

CURRENT DETECTOR CIRCUIT AND CURRENT MODE SWITCHING REGULATOR

BACKGROUND OF THE INVENTION

1. Field of the Invention

The present invention relates to a current mode switching regulator that controls an output voltage on the basis of the detected values of the output voltage and an output current by the aid of a DC input power supply, and a current detector circuit used for the switching regulator.

2. Description of the Related Art

A circuit structured as shown in FIG. 5 is used for a current mode step-down switching regulator (for example, refer to JP 2002-281742 A).

In the circuit, when a switch 107 is turned on, a current flows into a coil 108 from a power supply with the result that an input voltage Vi is accumulated in the coil 108 as an electric energy (that is, electric charges), and also accumulated in an output capacitor 112. Also, when the switch 107 is turned off, the electric energy that has been accumulated in the output capacitor 112 is discharged through a load.

Accordingly, in the current mode step-down switching regulator shown in FIG. 5, a voltage obtained by averaging (integrating) the electric energy that has been accumulated in the coil 108 by the output capacitor 112 is applied to the load.

An error amplifier 101 inputs a detection voltage obtained by dividing the output voltage by the aid of a resistor 110 and a resistor 111 at an inverting input terminal thereof, inputs a reference voltage Vref that has been output from a reference voltage source 100 at a non-inverting input terminal thereof, amplifies a difference between the detection voltage and the reference voltage Vref, and outputs the amplified result to the inverting input terminal of a comparator 105 as a detected amplification voltage.

An I/V circuit 121 detects a current that flows in the coil 108, generates a voltage corresponding to the detected current, and outputs the generated voltage to one input terminal of an adder 103.

An I/V circuit 122 detects a current that flows in the load, generates a voltage corresponding to the detected current, and outputs the generated voltage to another input terminal of the adder 103.

The adder 103 adds the voltages that are input from one input terminal and another input terminal together, and outputs the added result to the non-inverting input terminal of the comparator 105 as a compensation voltage.

That is, the compensation voltage is obtained by detecting currents that flow in the respective elements by the aid of a detector that is connected in series with the load or the coil 108, converting values proportional to the current values of the currents in the load or the coil 108 into voltage values, and adding those voltage values together by the adder 103.

The comparator 105 inputs the detected amplification voltage at an inverting input terminal thereof, inputs the compensation voltage at the non-inverting input terminal, compares the detected amplification voltage with the compensation voltage, and outputs the comparison result to a reset terminal R of an SR-latch 106 as a control signal. For that reason, the detected amplification voltage that is output by the error amplifier 101 increases more as the output voltage increases more. In the case where the detected amplification voltage exceeds the compensation voltage, the comparator 105 changes the control signal from H level to L level. On the other hand, in the case where the detected amplification voltage is lower than the compensation voltage, the comparator 105 changes the control signal from L level to H level.

Accordingly, when the SR-latch 106 inputs a clock signal of a given period to a set terminal thereof from an oscillator 104, and the SR-latch 106 changes the switch signal to H level when the SR-latch 106 is set. When the SR-latch 106 inputs a control signal of H level, the SR-latch 106 resets the output, and changes the switch signal to L level. The switch 107 is turned on when the input switch signal is H level, and turned off when the input switch signal is L level.

As described above, the current mode step-down switching regulator controls the duty of the switch signal which controls the on/off state of the switch 107 because the switching regulator generates the output voltage according to feedback information on both of the output voltage and the output current.

However, in the conventional example, because the current detector circuit that detects the current information that is input to the adder 103 generates a very small voltage from a very small current, the current detector circuit is made up of bipolar transistors or bi CMOS transistors (the mixture of bipolar transistors and CMOS transistors), resulting in such drawbacks that the process becomes complicated and the chip sizes cannot be reduced.

SUMMARY OF THE INVENTION

The present invention has been made in view of the above circumstances, and therefore an object of the present invention is to provide a current detector circuit that can be completely formed of complementary metal oxide semiconductor (CMOS), and simplified in process and reduced in chip size as compared with the conventional art.

According to the present invention, there is provided a current detector circuit (a current sense circuit in an embodiment of the present invention) that detects a current which flows in an object to be measured (a coil L in the embodiment of the present invention) and outputs a voltage corresponding to the current as a detection result (in the embodiment of the present invention, a current detector circuit that generates a sense voltage corresponding to a current value of a coil current which flows in the coil, and the sense voltage is slope-compensated by the voltage of the compensation lamp waveform and used for voltage control in a current mode switching regulator), the current detector circuit including: a first p-channel transistor (a p-channel transistor M11 in the embodiment of the present invention) having a source connected to a power supply and a gate grounded, which allows a current of 1/N of a current which flows trough a transistor which drives the object to be measured to pass therethrough; a second p-channel transistor (a p-channel transistor M12 in the embodiment of the present invention) having a source connected to a drain of the first p-channel transistor; a third p-channel transistor (a p-channel transistor M9 in the embodiment of the present invention) connected to a drain of a transistor (a p-channel transistor M1 in the embodiment of the present invention) that allows a current to flow in the coil; a voltage mirror circuit (a voltage mirror circuit 20 in the embodiment of the present invention) having one terminal connected to a drain of the second p-channel transistor and another terminal connected to a drain of the third p-channel transistor, and having the same voltage at the one terminal and the another terminal; and a first n-channel transistor (an n-channel transistor M5 in the embodiment of the present invention) having a drain connected to the drain of the first p-channel transistor, a source grounded through a sense resistor, and a gate to which a voltage operative in a saturation region is applied, in which the first n-channel transistor outputs a source voltage as the sense voltage.

In the current detector circuit of the present invention, the second p-channel transistor and the third p-channel transistor are formed to have the same sizes.

In the current detector circuit of the present invention, a voltage that turns on the second p-channel transistor and the third p-channel transistor is applied to gates of the second p-channel transistor and the third p-channel transistor during a period for detecting the current of the object to be measured (a period when the p-channel transistor M1 that allows the current to flow in the coil is on in the embodiment of the present invention).

Also, in the current detector circuit according to the present invention, the voltage mirror circuit includes: a second n-channel transistor (an n-channel transistor M3 in the embodiment of the present invention) having a drain connected to the one terminal; a third n-channel transistor (an n-channel transistor M4 in the embodiment of the present invention) having a drain connected to a source of the second n-channel transistor; a fourth n-channel transistor (an n-channel transistor M8 in the embodiment of the present invention) having a drain connected to the another terminal, and a gate connected to a gate of the second n-channel transistor; a fifth n-channel transistor (an n-channel transistor M6 in the embodiment of the present invention) having a drain connected to a source of the fourth n-channel transistor, and a gate connected to a gate of the third n-channel transistor; and an operational amplifier having a non-inverting input terminal connected to the one terminal, an inverting input terminal connected to the another terminal, and an output terminal connected to the gates of the second n-channel transistor and the fourth n-channel transistor, and a reference voltage is applied to the gates of the third n-channel transistor and the fifth n-channel transistor.

In the current detector circuit according to the present invention, the gate of the first n-channel transistor is connected to the drain of the third n-channel transistor.

The present invention also provides a current mode switching regulator, including: a slope compensation circuit that outputs a compensation lamp waveform for slope compensation; a current detector circuit that measures a current that flows in a coil used for voltage conversion to generate a sense voltage corresponding to the current; an adder that adds a voltage of the compensation lamp waveform and the sense voltage together to generate a corrected compensation sense voltage; and an output voltage control circuit that controls an output voltage by the corrected compensation sense voltage, in which any one of the above-mentioned current detector circuits is used as the current detector circuit to obtain the sense voltage as a detection result.

By employing the configuration described above, according to the present invention, the second p-channel transistor and the third p-channel transistor are inserted between the first p-channel transistor and the transistor that drives the coil used for voltage conversion, and the terminals of the voltage mirror circuit as detection switches, respectively. As a result, the drain-source voltage of the first p-channel transistor and the transistor that drives the coil can be made to have similar values. Also, because a current corresponding to a transistor ratio flows in the sense resistor, all of the transistors can be constituted by the CMOS structure, instead of forming the transistors as the bipolar transistors or the bi CMOS transistors as in the conventional art. For that reason, the process of the current mode switching regulator semiconductor device is simplified, the chip sizes can be reduced, and the manufacturing costs can be reduced.

As a result, according to the present invention, the current mode switching regulator can be inexpensively constituted in which the use of the above current sense circuit makes it possible to precisely generate the sense voltage corresponding to the current which flows in the coil, and the output voltage corresponding to the load can be output at a high speed and with a high precision.

DETAILED DESCRIPTION OF THE PREFERRED EMBODIMENTS

Figure 1:
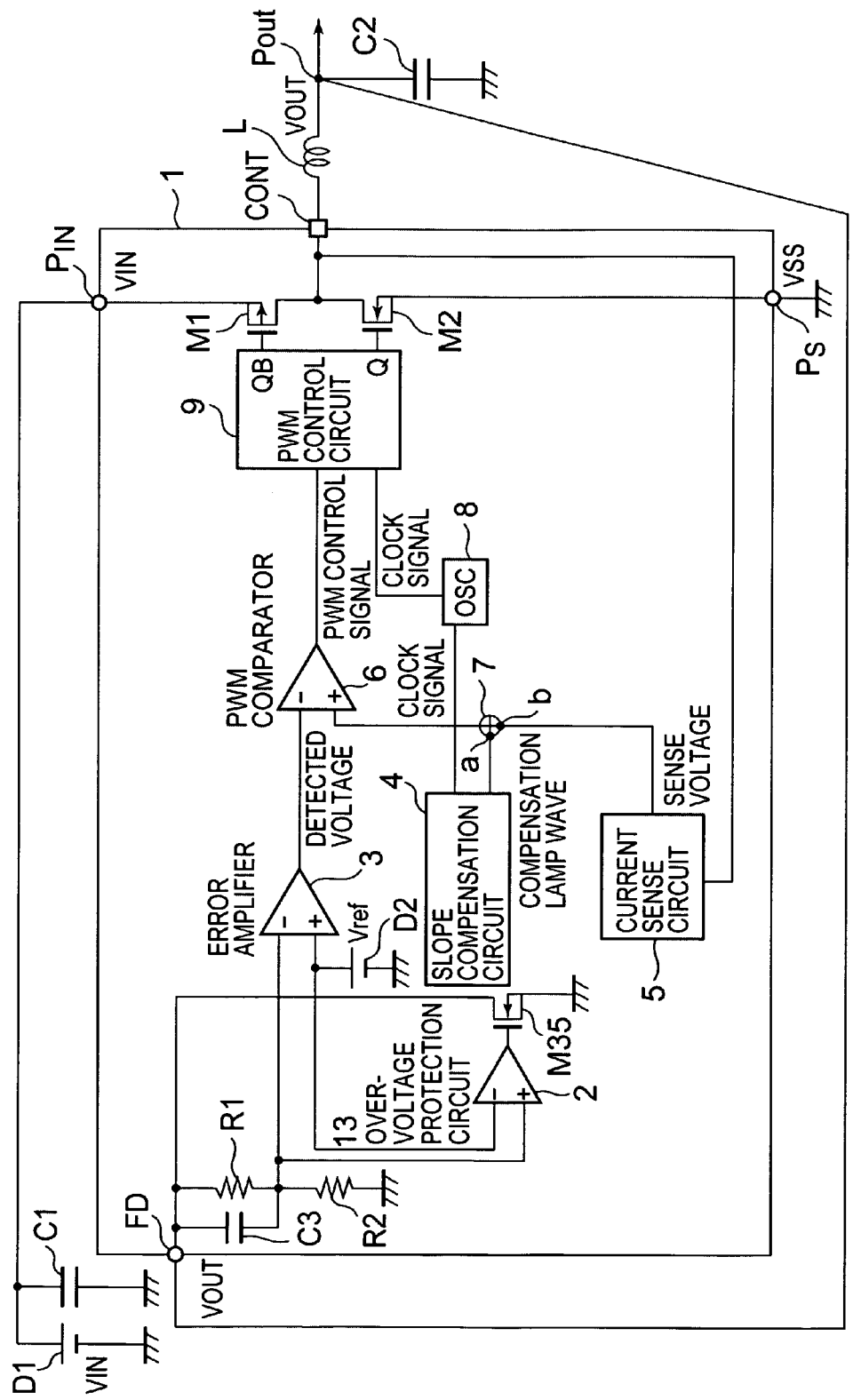
FIG. 1 is a conceptual diagram showing a structural example of a current mode switching regulator using a current sense circuit according to an embodiment of the present invention.

Hereinafter, a description will be given of a current mode step-down switching regulator semiconductor device 1 using a current detector or sense circuit 5 according to an embodiment of the present invention with reference to the accompanying drawings. FIG. 1 is a block diagram showing an example of the structure of the current mode step-down switching regulator according to the embodiment of the present invention. The most characteristic structure of the present invention resides in the current detector circuit 5 which is formed of a CMOS that measures at a high precision the current flowing in the coil (load) L of the p-channel transistor M1 to be used for controlling the output voltage Vout which is output from the output terminal Pout, and its details will be described below.

In FIG. 1, the current mode step-down switching regulator according to this embodiment is made up of a current mode step-down switching regulator semiconductor device 1, a coil L used for voltage conversion (step-down in this embodiment), and a smoothing capacitor C2 that smoothes the voltage that is output from the coil L. When a p-channel MOS transistor (hereinafter, referred to as "p-channel transistor") M1 is turned on, and an n-channel MOS transistor (hereinafter, referred to as "n-channel transistor") M2 is turned off, a current flows in a coil L from a power supply D1 through a terminal Pin and an output terminal (CONT terminal), and an input voltage Vin that is a voltage of the power supply D1 is accumulated in the coil L as an electric energy (that is, electric charges). Also, when the p-channel transistor M1 is turned off, and then-channel transistor M2 is turned on, the electric energy that has been accumulated in the coil L is discharged. A capacitor C1 is connected between the output terminal of the power supply D1 and a ground point.

The p-channel transistor M1 has a source connected to the terminal Pin, that is, the source connected to the power supply D1 through the terminal Pin, and the n-channel transistor M2 has a source connected to a terminal Ps, that is, the source grounded through the terminal Ps. The other respective circuits of an overvoltage protection circuit 13, an error amplifier 3, a slope compensation circuit 4, a current sense circuit 5, a PWM comparator 6, an adder 7, an oscillator 8, a PWM control circuit 9, and an OR circuit 12 are connected to the power supply D1 through the terminal Pin, and connected to the ground point through the terminal Ps.

Accordingly, in the current mode step-down switching regulator, the output voltage Vout that is output to the load from the output terminal Pout is adjusted between a period during which the electric energy is accumulated in the coil L and a period during which the electric energy is discharged from the coil L, and the output voltage Vout that has been averaged (integrated) by the coil L and the capacitor C2 is supplied to the load.

The p-channel transistor M1 has a drain connected to the drain of the n-channel transistor M2 and a terminal CONT (series connection), and the coil L has one end connected to the terminal CONT, and another end thereof connected to the load (that is, output terminal Pout). Also, the p-channel transistor M1 has a gate connected to a terminal QB of a PWM control circuit 9, and the n-channel transistor M2 has a gate connected to a terminal Q of the PWM control circuit 9.

The error amplifier 3 has an inverting terminal input with a voltage at the output terminal which is a connection point between a capacitor C2 and the coil L, that is, a divided voltage resulting from dividing the output voltage Vout by a resistor R1 and a resistor R2 (a series-connected divider circuit), and a non-inverting terminal input with a reference voltage Vref that is output by a reference power supply D2 to amplify a difference between the divided voltage and the reference voltage Vref. The error amplifier 3 outputs the amplified result to the inverting input terminal of the PWM comparator 6 as a detected voltage. Also, a phase control capacitor C3 is inserted between a terminal FD that is input with the output voltage Vout and the connection point between the resistor R1 and the resistor R2.

In the output voltage Vout that is output by the switching regulator, a target voltage that is a target value of the voltage that is applied to the load is set as the reference voltage Vref of the reference power supply D2 connected to the error amplifier 3. That is, in this embodiment, the definition of the target voltage represents a voltage set as a control target that is given to the load of the output voltage. In the error amplifier 3, the reference voltage is a voltage that is compared with the divided voltage resulting from dividing the output voltage by the divider circuit as already described above, and the divided voltage obtained when the output voltage coincides with the target voltage is set. Accordingly, in the case where the divided voltage resulting from dividing the output voltage by the divider circuit exceeds the reference voltage, the output voltage exceeds the target voltage.

The slope compensation circuit 4 generates a sawtooth compensation lamp wave (voltage waveform that sequentially changes into a linear shape by a slope m which will be described later) in synchronism with a period T of the frequency of the clock signal that is oscillated by the oscillator 8, and outputs the compensation lamp wave to an input terminal "a" of the adder 7.

The current sense circuit 5 detects a current value of a current that flows in the coil L, that is, detects a current variation in correspondence with a variation in the load capacity, generates a sense voltage (corresponding to the current value of a current that flows in the coil) S1, and outputs the sense voltage S1 to the input terminal "b" of the adder 7. The sense voltage is subjected to slope compensation (correction) by the voltage of the compensation lamp wave which is output by the slope compensation circuit 4.

In this example, because the output voltage Vout changes in correspondence with a change in the current that flows in the coil L, the sense voltage corresponding to the current change of the current that flows in the coil L is obtained with respect to the voltage value of the compensation lamp wave of the slop compensation, and the sense voltage is fed back to the compensation lamp wave to conduct high-precision control as described later.

That is, a period during which the p-channel transistor M1 is turned on is adjusted in correspondence with the current that flows in the coil L. Accordingly, because the sense voltage corresponding to the current that flows in the coil L is slope-compensated by the voltage of the compensation lamp wave, and the output voltage is determined by the current that flows in the coil L (primary information), a response speed of the control with respect to the load change becomes high.

As described above, the adder 7 adds a voltage value of the compensation lamp wave that is output by the slope compensation circuit 4 (input to the input terminal "a") and a sense voltage that is output from the current sense circuit 5 (input to an input terminal "b") together to slope-compensate a sense voltage corresponding to the current that flows in the coil L by the compensation lamp wave to output the compensated sense voltage to the non-inverting input terminal of the PWM comparator 6.

Figure 2:
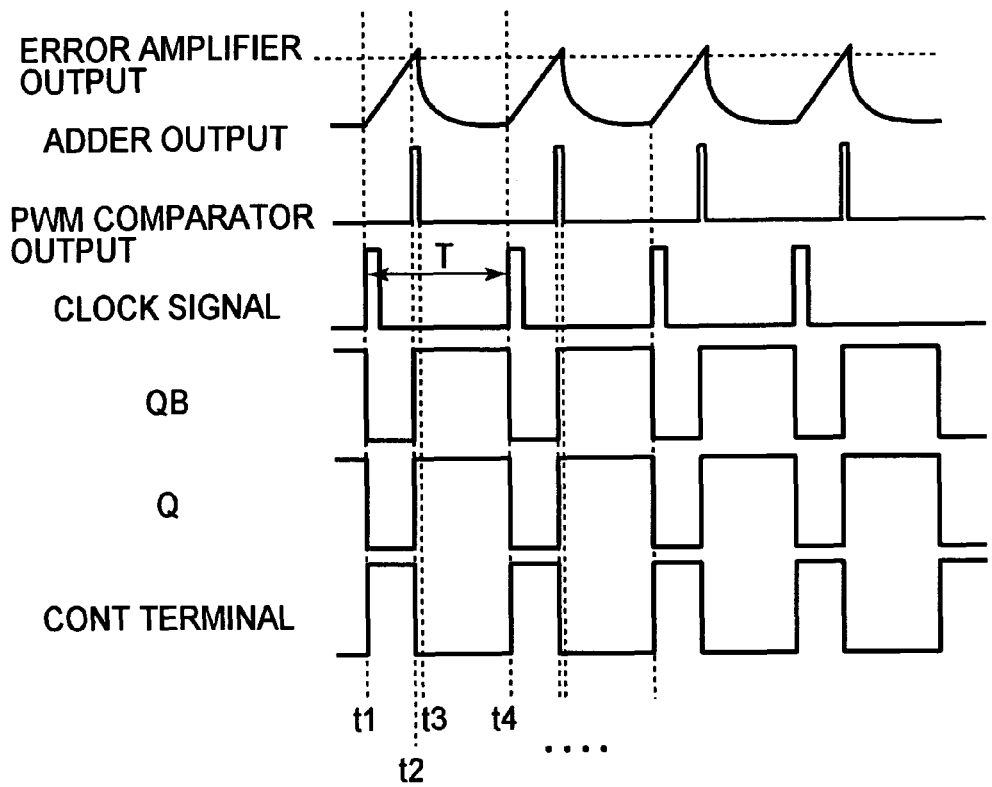
FIG. 2 is a waveform diagram for explaining the operation of the current mode switching regulator shown in FIG. 1.

The PWM comparator 6 compares the detected voltage that is output from the error amplifier 3 with the voltage value of the slope-compensated sense voltage which is input from the adder 7, and outputs the PWM control signal as a pulse of H level when the voltage value of the compensation lamp wave exceeds the detected voltage as shown in FIG. 2.

The oscillator 8 periodically outputs clock signals (pulses of H level) in a predetermined period T.

As shown in FIG. 2, the PWM control circuit 9 applies a voltage of L level to the gate of the p-channel transistor M1 through the output terminal QB to turn on the p-channel transistor M1, and applies a voltage of L level to the gate of the n-channel transistor M2 through the output terminal Q to turn off the n-channel transistor M2, in synchronism with a leading edge of the clock signal.

Further, the PWM control circuit 9 applies a voltage of H level to the gate of the p-channel transistor M1 through the output terminal QB to turn off the p-channel transistor M1, and applies a voltage of H level to the gate of the n-channel transistor M2 through the output terminal Q to turn on the n-channel transistor M2, in synchronism with a leading edge of the PWM control signal (pulse of H level).

The overvoltage protection circuit 2 has a non-inverting input terminal input with the divided voltage, and an inverting input terminal input with the reference voltage Vref. When the output voltage exceeds a predetermined voltage, that is, the divided voltage corresponding to the output voltage exceeds the reference voltage Vref, the overvoltage protection circuit 2 turns on a n-channel transistor M13 to drop the output voltage Vout for load protection and the protection of the semiconductor device 1.

In the above slope compensation, there has been known that when the current that flows in the coil operates in the duty cycle of continuous 50% or higher at a continuous mode in the current mode switching regulator, oscillation occurs in the cycle of integer times of the switching frequency, that is, sub-harmonic oscillation occurs. In this example, an up slope of the current that flows in the coil is determined according to the input voltage Vin and the inductance value of the coil L, and a down slope of the current that flows in the coil is determined according to the energy consumption of the load which is connected to the output terminal.

Figure 3:
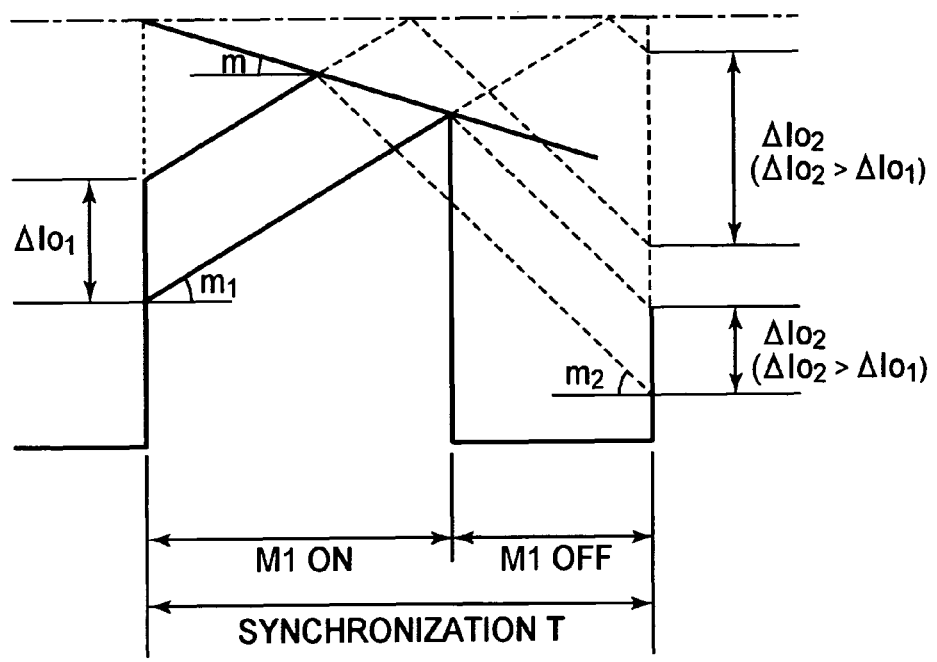
FIG. 3 is a waveform diagram for explaining the operation of slope compensation in the current mode switching regulator shown in FIG. 1.

Even in the same cycle, the duty of switching on/off of the p-channel transistor M1 and the n-channel transistor M2 frequently vary. As shown in FIG. 3, when a current IL that flows in the coil starts from a point shifted by ΔIo, ΔIo1<ΔIo2 is satisfied in the subsequent cycle, the current value that starts gradually increases, and the operation is stabilized in a certain cycle. As a result, the sub-harmonic oscillation occurs.

Conversely, when control is conducted so that the shifted current satisfies ΔIo1>ΔIo2, that is, the current Io that starts gradually decreases, the change is gradually converged to stabilize the operation.

For that reason, in order to reduce the start current in the subsequent cycle, the above slope compensation is required so that the coil current that causes the sub-harmonic oscillation stably operates even in the duty cycle of continuous 50% or higher.

In order to conduct the stable operation, a slope m of an up line of the slope compensation needs to be represented by the following expression so as to satisfy Δio1>Δio2 generally in the case of the current mode step-down switching regulator.

$$m \geq (m2-m1)/2 = (2Vout-Vin)/2L$$

where m2 is a slope of the down slop of the coil current, that is, a current decrease rate, which is presented by the following expression.

$$m2 = (Vout-Vin)/L$$

Also, m1 is a slope of the up slop of the coil current, that is, a current increase rate, which is presented by the following expression.

$$m1 = Vin/L$$

The slope compensation circuit 4 outputs the compensation lamp wave of the sawtooth slope compensation having the above slopes of m in synchronism with the clock signal that is output by the oscillator 8.

Figure 4:
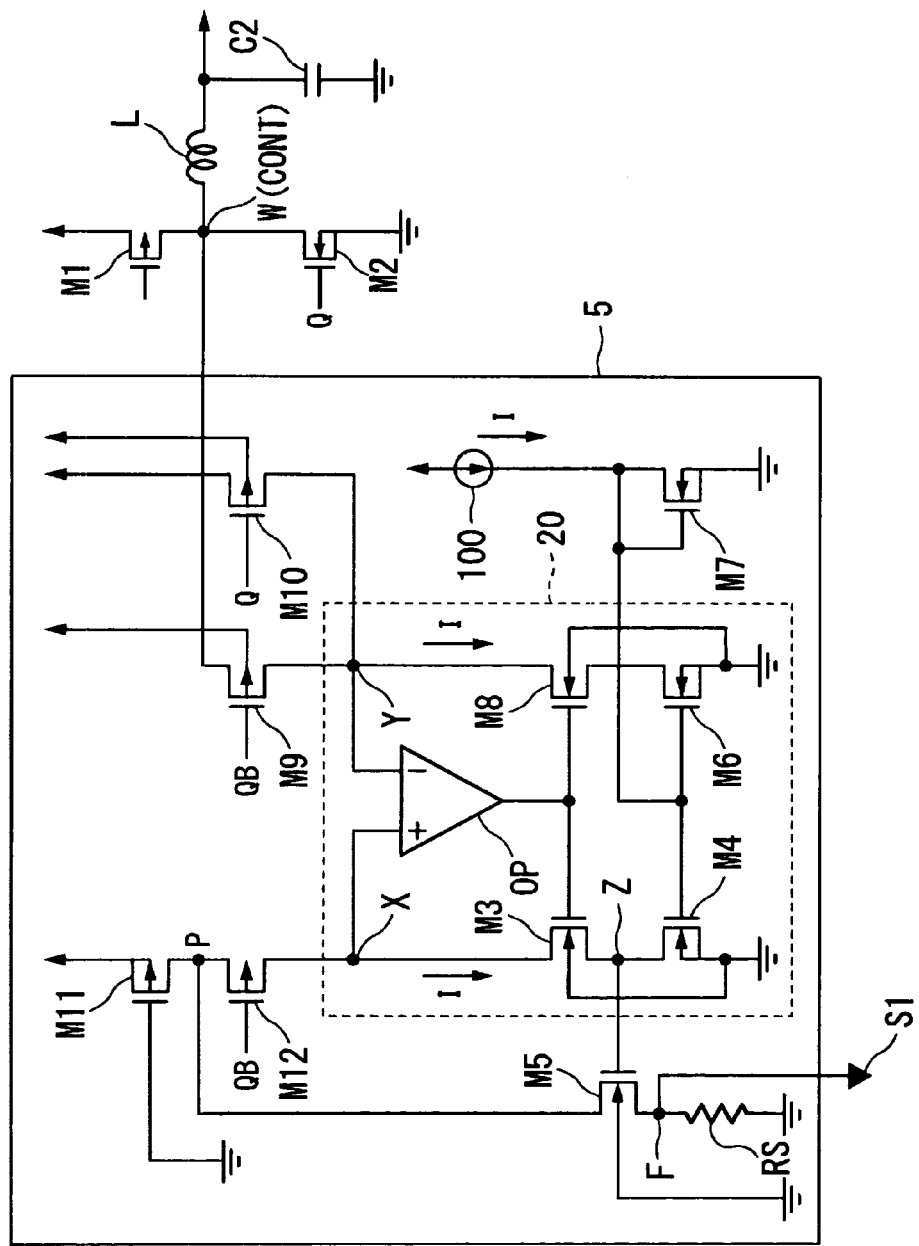
FIG. 4 is a conceptual diagram showing a structural example of a current sense circuit in the current mode switching regulator shown in FIG. 1.
Figure 5:
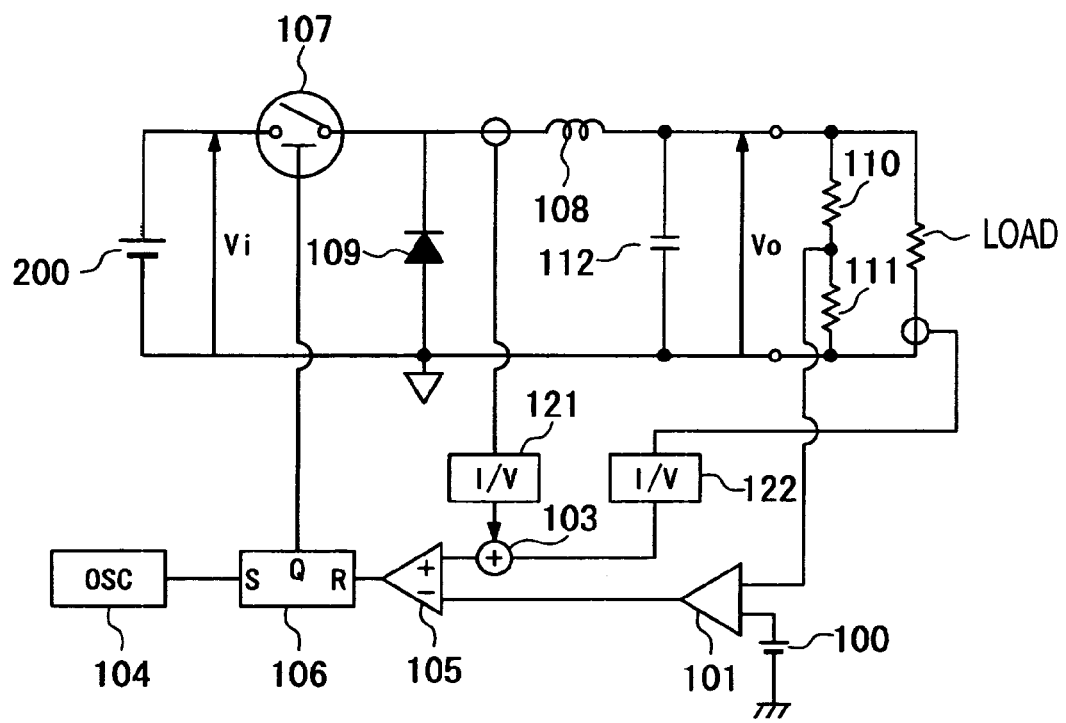
FIG. 5 is a conceptual diagram showing a structural example of a conventional current mode switching regulator.

Subsequently, a description will be given of the current sense circuit 5 according to the embodiment of the present invention in detail with reference to FIG. 4. FIG. 4 is a conceptual diagram showing a structural circuit example of the current sense circuit 5 according to this embodiment.

The current sense circuit 5 is made up of p-channel transistors M9, M10, M11, M12, n-channel transistors M3, M4, M5, M6, M7, M8, an operational amplifier OP, and a sense resistor Rs.

The p-channel transistor M9 has a source connected to the drain of the p-channel transistor M1 (output buffer), that is, another end (connection point W) of the coil L having one end connected to the load, and a gate connected to the output terminal QB of the PWM control circuit 9.

The p-channel transistor M10 has a source connected to the power supply line of the supply voltage (Vin) due to the power supply D1, a gate connected to the output terminal Q of the PWM control circuit 9, and a drain connected to the drain of the p-channel transistor M9 at the connection point Y. In this example, the respective other transistors in the respective current sense circuits 5 are similarly applied with the supply voltage Vin through the power supply line which is connected to the power supply D1 through the terminal Pin.

The p-channel transistor M11 has a source connected to the power supply line of the supply voltage, and a gate connected to the output terminal QB of the PWM control circuit 9.

The p-channel transistor M12 has a source connected to a drain of the p-channel transistor M11, that is, the connection point X, and a gate connected to the output terminal QB of the PWM control circuit 9.

The n-channel transistors M3, M4, M5, M6, M7, and M8, and the operational amplifier OP constitute a voltage mirror circuit 20, and the voltage mirror circuit 20 operates so that the voltage at the connection point X is identical with the voltage at the connection point Y.

Also, when the p-channel transistor M9 and the p-channel transistor M12 are different in transistor size (channel length and channel width), there occurs an error in the respective drain-source voltages. Therefore, the p-channel transistor M9 and the p-channel transistor M12 have the same transistor size, and are formed with the same threshold voltage. In order to prevent the process variation, a layout in which the p-channel transistor M9 and the p-channel transistor M12 are closely arranged is designed.

In this example, the n-channel transistor M3 has a drain connected to the connection point X, and a source connected to a drain of the n-channel transistor M4. The n-channel transistor M4 has a source grounded.

The n-channel transistor M8 has a drain connected to the connection point Y, and a source connected to a drain of the n-channel transistor M6. The n-channel transistor M6 has a source grounded.

The operational amplifier OP has a non-inverting input terminal connected to the connection point X, an inverting input terminal connected to the connection point Y, and an output terminal connected to gates of the n-channel transistors M3 and M8.

The n-channel transistor M7 has a drain and a gate connected to the wiring of the supply voltage through the constant current source 100, and a source grounded, and a constant current I from the constant current source 100 flows therein.

The gates of the n-channel transistors M4 and M6 are connected to the gate and drain of the n-channel transistor M7, and biased, the constant current I flows in the n-channel transistors M4 and M6.

The n-channel transistor M5 has a drain connected to the connection point P between the drain of the p-channel transistor M11 and the source of the p-channel transistor M12, a gate connected to the connection point Z between the source of the n-channel transistor M3 and the drain of the n-channel transistor M4, and a source grounded through the sense resistor Rs. A voltage at the connection point F between the source of the n-channel transistor M5 and the sense resistor Rs is output to one input terminal of the adder 7 as the sense voltage S1. In this example, the n-channel transistor M3 and the n-channel transistor M5 are Darlington-connected, and the gate voltage is set so that the n-channel transistors M3 and M5 operate in the saturation region.

The p-channel transistor M11 is formed at 1/N of the transistor size of the p-channel transistor M1, that is, formed so that a current of 1/N of the p-channel transistor M1 flows therein.

The constant current I makes the voltage mirror circuit 20 operate, and a fine current (for example, 1 μA) necessary to only make the voltages at the connection points X and Y identical with each other flows therein. Also, the operational amplifier Op is of a general circuit structure that is formed of CMOS semiconductors.

Accordingly, the sense voltage S1 is output as a potential difference across the sense resistor Rs as a voltage value corresponding to the current of 1/N of the current that flows in the coil L. The sense resistance Rs does not cause an error in the drain-source voltage of the p-channel transistor M11, and therefore is set to a low resistance (for example, several tens to several hundreds Ω) indicated below.

The voltage at the output terminal of the operational amplifier OP is determined according to the $V_{gs}$ (gate-source voltage) of the n-channel transistor M3, $V_{gs}$ of the n-channel transistor M5, and VA. In this example, VA is obtained by multiplying $R_{sense}$ (the resistance of $R_s$) by the current value ID (drain current) that flows in the n-channel transistor. Accordingly, the voltage at the output terminal of the operational amplifier OP becomes $V_{gs}$ (M3)+$V_{gs}$ (M5)+$R_{sense}$×ID. For that reason, the resistance $R_{sense}$ is set so that $V_{gs}$ (M3)+$V_{gs}$ (M5)+$R_{sense}$×ID does not exceed the upper limit of a predetermined amplitude range of the output voltage of the operational amplifier OP.

For example, when it is assumed that $V_{gs}$ (M3)=0.6 V, $V_{gs}$ (M5)=0.6 V, ID is 1 mA, and the upper limit of the amplitude range of the output voltage of the amplifier is 2.8 V, $R_{sense}$=1600Ω is set.

With the above configuration, the current detector circuit according to this embodiment can realize the structure in which the sense voltage S1 of the fine voltage that corrects the voltage of the compensation lamp waveform from the large current which flows in the coil L is readily generated, by the COMS transistors. As a result, in this embodiment, the current detector circuit can be readily manufactured by the normal CMOS process without using the bipolar transistors or the bi CMOS transistors as in the conventional art. Therefore, the current detector circuit can be mixed with the logic circuit and can be miniaturized, and the manufacture costs of the chip can be reduced more than in the conventional art.

Hereinafter, a description will be given of the operation of the current mode step-down switching regulator shown in FIG. 1 including the operation of the current sense circuit 5 according to this embodiment with reference to FIG. 2.

At a time t1, when the oscillator 8 outputs the clock signal as the pulse signal of H level, the PWM control circuit 9 transits the output terminal QB from H level to L level, and also transits the output terminal Q from H level to L level.

As a result, the p-channel transistor M1 is turned on, the n-channel transistor M2 is turned off, and the a drive current flows in the coil L from the power supply D1, thereby allowing the electric energy to be accumulated in the coil L.

In this situation, the slope compensation circuit 4 starts the output of the compensation lamp wave that changes linearly with the slope m (go up with the slope m in this embodiment) in synchronism with the clock signal.

Also, the p-channel transistor M12 and the p-channel transistor M9 input the control signal of L level to the gates to be turned on, respectively.

That is, the p-channel transistor M12 and the p-channel transistor M9 operate as switches for generating the sense voltage S1 corresponding to the current which flows in the coil L by the current sense circuit 5 during a period where the current flows in the coil L.

Because the connection points X and Y have the same voltage, the source-drain voltages of the p-channel transistor M12 and the p-channel transistor M9 become identical with each other, that is, have the same voltage as that at the connection point W at which another end of the coil L and the drain of the p-channel transistor M9 are connected to each other. As a result, the current of the current value of 1/N precisely flows in the n-channel transistor M5 from the connection point P with respect to the current that flows in the coil L.

As a result, the current sense circuit 5 outputs the voltage drop between the terminals of the sense resistor Rs as the sense voltage, that is, the sense voltage S1. In this case, in the case where the resistance of the sense resistor Rs is not appropriately adjusted as described above, when the sense voltage S2 becomes larger, the output voltage of the operational amplifier OP is saturated to conduct no normal operation, and the gate-source voltages of the p-channel transistors M11 and M1 are different from each other, and no precise current value is obtained.

In this situation, in the case where the voltage Vx at the connection point X is lower than the voltage Vy at the connection point Y, that is, in the case where the coil current increases, the output voltage of the operational amplifier OP is lowered, and the source voltage of the n-channel transistor M3, that is, the voltage Vz of the connection point Z is also lowered. With the decrease of the voltage Vz, the source voltage of the n-channel transistor M5, that is, the sense voltage S1 is lowered. As a result, the drain current of the n-channel transistor M3 is reduced, and the voltage Vx is increased to constitute a feedback loop.

That is, the operational amplifier OP reverses the polarity of the voltage that is output from the output terminal according to a change in the source voltage of the n-channel transistor M3, forms a negative feedback loop, and adjusts the voltage so as to meet Vx=Vy.

The adder 7 adds the sense voltage S1 that is input from the input terminal "b" to the voltage value of the compensation lamp wave which is input to one input terminal "a", and outputs the sense voltage S1 that has been slope-compensated by the voltage of the compensation lamp wave to the inverting input terminal of the PWM comparator 6.

As a result, the PWM comparator 6 compares the detected voltage that is input from the error amplifier 3 with the voltage obtained by slope-compensating the sense voltage S1 corresponding to the current that flows in the coil L by the compensation lamp wave, and feeds back the current value of the current that flows in the coil L in real time so as to output the PWM control signal that controls a period of time during which the p-channel transistor M1 is on.

At a time t2, the PWM comparator 6 transits the voltage of the output PWM control signal from L level to H level when the PWM comparator 6 detects that the voltage of the compensation lamp wave which linearly goes up with the slope m exceeds the output voltage of the error amplifier 3.

Then, the PWM control circuit 9 transits the voltage of the PWM control signal that is input from the PWM comparator 6 from L level to H level to transit the voltage output from the output terminal QB from L level to H level, and transits the voltage output from the output terminal Q from L level to H level.

As a result, the p-channel transistor M1 is turned off, and the n-channel transistor M2 is turned on to discharge the electric energy that is accumulated in the coil L.

In this situation, the gate voltages of the p-channel transistor M12 and the p-channel transistor M9 change from L level to H level, thereby turning off the p-channel transistor M12 and the p-channel transistor M9.

In this case, when the connection point Y becomes floating and comes to an unstable voltage state, in order to prevent the current sense circuit 5 from malfunctioning, and the noises from being amplified to output the sense voltage S1, the gate of the p-channel transistor M10 is transited from H level to L level to obtain the supply voltage value at the connection point Y.

Subsequently, at a time t3, the slope compensation circuit 4 stops the output of the compensation lamp wave when the compensation lamp wave becomes a set maximum value.

As a result, the PWM comparator 6 transits the voltage of the output PWM control signal from H level to L level when the voltage of the compensation lamp wave is detected to be lower than the output voltage of the error amplifier 3.

Subsequently, at a time t4, the oscillator 8 outputs the clock signal, the subsequent cycle starts, and the operation of from the t1 to the time t4 is repeated as described above.

With the above structure, the current mode switching regulator semiconductor device according to this embodiment has the current sense circuit with the CMOS structure as described above, that is, that p-channel transistor M12 which has the same transistor sizes and the same threshold voltage as those of the p-channel transistor M9 and is disposed close to the p-channel transistor M9 in the layout. As a result, it is possible to suppress the error current caused by offset from flowing in the n-channel transistor M5 without offsetting the gate-source voltage in the p-channel transistor M11 and the p-channel transistor M1. Also, the precise current of 1/N that flows in the coil L is detected, and the sense voltage S1 corresponding to the current is supplied to the adder 7. As a result, the voltage of the compensation lamp waveform of the slope compensation can be corrected in real time by the current information of the current that flows in the coil L, and the on-period of the p-channel transistor M1 can be controlled at a high speed according to the current that flows in the coil L.

Also, in this embodiment, the current detector circuit of the present invention has been described with reference to the current mode step-down switching regulator. Alternatively, the current detector circuit of the present invention can be used in a current mode step-up switching regulator.

What is claimed is:

1. A current detector circuit that detects a current flowing in an object and that outputs a voltage corresponding to the detected current as a detection result, the current detector circuit comprising:
    a first p-channel transistor having a source connected to a power supply and a gate connected to a ground, the first p-channel transistor being configured to allow the passage therethrough of a current that is 1/N of a current flowing through a transistor which drives the object;
    a second p-channel transistor having a source connected to a drain of the first p-channel transistor;
    a third p-channel transistor connected to the object;
    a voltage mirror circuit having a first terminal connected to a drain of the second p-channel transistor and a second terminal connected to a drain of the third p-channel transistor, the first terminal and the second terminal having the same voltage potential; and
    a first n-channel transistor having a drain connected to the drain of the first p-channel transistor, a source grounded through a sense resistor, and a gate to which a voltage operative in a saturation region is applied, the first n-channel transistor outputting a source voltage as the detection result of the current detector circuit.

2. A current detector circuit according to claim 1; wherein the second p-channel transistor has the same size as that of the third p-channel transistor.

3. A current detector circuit according to claim 1; wherein the second and third p-channel transistors are configured so that a voltage that turns ON each of the second and third p-channel transistors is applied to a gate of each of the second and third p-channel transistors during a period in which the current detector circuit detects the current flowing in the object.

4. A current detector circuit according to claim 2; wherein the second and third p-channel transistors are configured so that a voltage that turns ON each of the second and third p-channel transistors is applied to a gate of each of the second and third p-channel transistors during a period in which the current detector circuit detects the current flowing in the object to be measured.

5. A current detector circuit according to claim 1; wherein the voltage mirror circuit comprises:
    a second n-channel transistor having a drain connected to the first terminal of the first n-channel transistor;
    a third n-channel transistor having a drain connected to a source of the second n-channel transistor;
    a fourth n-channel transistor having a drain connected to the second terminal of the first n-channel transistor and a gate connected to a gate of the second n-channel transistor;
    a fifth n-channel transistor having a drain connected to a source of the fourth n-channel transistor and a gate connected to a gate of the third n-channel transistor, the third and fifth n-channel transistors being configured so that a reference voltage is applied to the gates of the third and fifth n-channel transistors; and
    an operational amplifier having a non-inverting input terminal connected to the first terminal of the first n-channel transistor, an inverting input terminal connected to the second terminal of the first n-channel transistor, and an output terminal connected to the gates of the second n-channel transistor and the fourth n-channel transistor.

6. A current detector circuit according to claim 5; wherein the gate of the first n-channel transistor is connected to the drain of the third n-channel transistor.

7. A current mode switching regulator, comprising:
    a slope compensation circuit that outputs a compensation lamp waveform for slope compensation;
    a current detector circuit according to claim 1 that a current flowing in a coil to generate as the detection result a sense voltage corresponding to the detected current;
    an adder that adds together a voltage of the compensation lamp waveform and the sense voltage generated by the current detector circuit to generate a compensation sense voltage that has been subjected to slope correction; and
    an output voltage control circuit that controls an output voltage by the compensation sense voltage.

8. A current mode switching regulator according to claim 7; wherein the second and third p-channel transistors of the current detector circuit have the same size.

9. A current mode switching regulator according to claim 8; wherein the second and third p-channel transistors are configured so that a voltage that turns ON each of the second and third p-channel transistors is applied to a gate of each of the second and third p-channel transistors during a period in which the current detector circuit detects the current flowing in the object to be measured.

10. A current mode switching regulator according to claim 7; wherein the second and third p-channel transistors of the current detector circuit are configured so that a voltage that turns ON each of the second and third p-channel transistors is applied to a gate of each of the second and third p-channel transistors during a period in which the current detector circuit detects the current flowing in the coil.

11. A current mode switching regulator according to claim 7; wherein the voltage mirror circuit of the current detector circuit comprises:
    a second n-channel transistor having a drain connected to the first terminal of the first n-channel transistor;
    a third n-channel transistor having a drain connected to a source of the second n-channel transistor;

a fourth n-channel transistor having a drain connected to the second terminal of the first n-channel transistor and a gate connected to a gate of the second n-channel transistor;

a fifth n-channel transistor having a drain connected to a source of the fourth n-channel transistor and a gate connected to a gate of the third n-channel transistor, the third and fifth n-channel transistors being configured so that a reference voltage is applied to the gates of the third and fifth n-channel transistors; and an operational amplifier having a non-inverting input terminal connected to the first terminal of the first n-channel transistor, an inverting input terminal connected to the second terminal of the first n-channel transistor, and an output terminal connected to the gates of the second n-channel transistor and the fourth n-channel transistor.

12. A current mode switching regulator according to claim 11; the gate of the first n-channel transistor is connected to the drain of the third n-channel transistor.

13. A current mode switching regulator, comprising:

a slope compensation circuit that outputs a compensation lamp waveform for slope compensation;

a current detector circuit according to claim 1 that detects a current supplied to a load to generate a detection voltage corresponding to the detected current;

an adder that adds together a voltage of the compensation lamp waveform and the detection voltage generated by the current detector circuit to generate a compensation sense voltage that has been subjected to slope correction; and an output voltage control circuit that controls an output voltage by the compensation sense voltage.

14. A current detector circuit that detects a current that is supplied to a load to generate a detection voltage corresponding to the detected current, the current detector circuit comprising:

a first p-channel transistor having a source that connects to a power supply and a gate that connects to a ground, a size of the first p-channel transistor relative to a size of a drive transistor for driving a load being a preselected ratio of first p-channel transistor size to drive transistor size, and the first p-channel transistor being configured to allow the passage therethrough of a current flowing through a drive transistor equal to the preselected ratio;

a second p-channel transistor having a source connected to a drain of the first p-channel transistor;

a third p-channel transistor that connects to a drain of the drive transistor;

a voltage mirror circuit having a first terminal connected to a drain of the second p-channel transistor and a second terminal connected to a drain of the third p-channel transistor; and a n-channel transistor that outputs a source voltage as the detection voltage generated by the current detection circuit, the n-channel transistor having a drain connected to the drain of the first p-channel transistor and a source that connects to a ground.

15. A current detector circuit according to claim 14; wherein the first and second terminals of the voltage mirror circuit have the same voltage potential.

16. A current detector circuit according to claim 14; wherein the source of the n-channel transistor is grounded through a sense resistor; and wherein the gate of the n-channel transistor is configured for application thereto of a voltage operative in a saturation region.

17. A current detector circuit according to claim 14; wherein the second p-channel transistor has the same size as that of the third p-channel transistor.

18. A current detector circuit according to claim 14; wherein the second and third p-channel transistors are configured so that a voltage that turns ON each of the second and third p-channel transistors is applied to a gate of each of the second and third p-channel transistors during a period in which the current detector circuit detects the current supplied to the load.

19. A current detector circuit according to claim 14; wherein the voltage mirror circuit comprises:

the n-channel transistor as a first n-channel transistor;

a second n-channel transistor having a drain connected to the first terminal of the first n-channel transistor;

a third n-channel transistor having a drain connected to a source of the second n-channel transistor;

a fourth n-channel transistor having a drain connected to the second terminal of the first n-channel transistor and a gate connected to a gate of the second n-channel transistor;

a fifth n-channel transistor having a drain connected to a source of the fourth n-channel transistor and a gate connected to a gate of the third n-channel transistor, the third and fifth n-channel transistors being configured so that a reference voltage is applied to the gates of the third and fifth n-channel transistors; and an operational amplifier having a non-inverting input terminal connected to the first terminal of the first n-channel transistor, an inverting input terminal connected to the second terminal of the first n-channel transistor, and an output terminal connected to the gates of the second n-channel transistor and the fourth n-channel transistor.

20. A current detector circuit according to claim 19; wherein the gate of the first n-channel transistor is connected to the drain of the third n-channel transistor.

* * * * *